(12) United States Patent
Lin et al.

(10) Patent No.: US 6,246,436 B1
(45) Date of Patent: Jun. 12, 2001

(54) ADJUSTABLE GAIN ACTIVE PIXEL SENSOR

(75) Inventors: Jane M. J. Lin, San Jose; Eric Y. Chou, Fremont; Kit M. Cham, Cupertino, all of CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 0 days.

(21) Appl. No.: 08/962,628

(22) Filed: Nov. 3, 1997

(51) Int. Cl.$^7$ .................................................. H04N 5/335
(52) U.S. Cl. ............................................ 348/308; 307/230
(58) Field of Search ...................................... 348/229, 230, 348/295, 362, 302, 300, 301, 303, 304, 305, 306, 307, 308, 309, 310

(56) References Cited

U.S. PATENT DOCUMENTS

| | | | |
|---|---|---|---|
| 4,285,582 | * 8/1981 | Yamazaki | 396/157 |
| 4,583,002 | 4/1986 | Kondo et al. | 250/578 |
| 4,669,063 | * 5/1987 | Kirsch | 365/149 |
| 4,839,735 | * 6/1989 | Kyomasu et al. | 348/297 |
| 4,943,839 | 7/1990 | Kumano et al. | 357/30 |
| 5,289,023 | 2/1994 | Mead | 257/291 |
| 5,329,112 | 7/1994 | Mihara | 250/208.1 |
| 5,969,758 | * 10/1999 | Sauer et al. | 348/308 |

* cited by examiner

*Primary Examiner*—Wendy R. Garber
*Assistant Examiner*—Mitchell White

(57) ABSTRACT

An active pixel sensor. The active pixel sensor includes a photo-diode. The photo-diode conducting charge as a function of the intensity of light received by the photo-diode. The photo-diode includes a diode capacitance which collects charge conducted by the photo-diode which generates a photo-diode voltage. A switched capacitor is connected in parallel with the photo-diode when the photo-diode voltage drops below a pre-determined voltage potential. A capacitance of the switched capacitor adds to the diode capacitance when the switched capacitor is connected. The switched capacitor can be a gate capacitor. The active pixel sensor further includes electronic circuitry to allow a controller to sample the photo-diode voltage.

9 Claims, 5 Drawing Sheets

ADJUSTABLE GAIN ACTIVE PIXEL SENSOR

FIELD OF INVENTION

This invention relates generally to an active pixel sensor. In particular, it relates to an active pixel sensor in which the sensitivity of the active pixel sensor is adjusted depending on the intensity of light being received by the active pixel sensor.

BACKGROUND

An electronic camera generally converts an optical image into a set of electronic signals. The electronic signals may represent intensities of colors of light received by the camera. The electronic camera typically includes an array of image sensors or light sensitive sensors which detect the intensity of light received by the camera. The image sensors typically generate electronic signals that have amplitudes that are proportionate to the intensity of the light received by the sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic camera systems to be low cost, compact and require low power.

Historically, image sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

FIG. 1 shows a circuit schematic of a prior art active pixel sensor. The active pixel sensor is generally included within an array of active pixel sensors. The active pixel sensor includes a photo-diode D1, a reset transistor Q1, a bias transistor Q2 and a select transistor Q3. The photo-diode D1 collects charge when the photo-diode D1 is exposed to light. The photo-diode D1 includes an inherent capacitance Cd which capacitively loads a signal node N2. The charge collected by the photo-diode D1 is accumulated on the capacitance Cd of the photo-diode D1 creating a photo-diode voltage which is proportional to the intensity of light received by the photo-diode D1. The photo-diode voltage is created at the cathode of the photo-diode D1.

The reset transistor allows the photo-diode D1 to be reset by discharging the photo-diode capacitance Cd. A RST (reset) line discharges the photo-diode capacitance Cd by pulsing the RST line high to set the cathode of the photo-diode to a predetermined reset voltage. The predetermined reset voltage for the active pixel sensor shown in FIG. 1 is voltage potential of the RST line minus the threshold voltage of the reset transistor Q1.

The select transistor Q3 allows a controller to selectively sample the photo-diode voltage at a PIXOUT output of a particular active pixel sensor by pulsing a SELECT line to cause the select transistor Q3 to conduct.

FIG. 2 is a plot of a signal voltage of the photo-diode D1 of the active pixel sensor shown in FIG. 1. The signal voltage is defined as a reference voltage minus the voltage potential of the PIXOUT output. The reference voltage is defined as the voltage potential of the PIXOUT output when the signal node N2 is reset to the predetermined reset voltage. The greater the intensity of light received by the photo-diode D1, the greater the signal voltage. The charge conducted by the photo-diode D1 is proportional to the intensity of light received by the photo-diode D1. As depicted by the plot, the signal voltage begins to saturate as the charge conducted by the photo-diode increases. The saturation voltage $V_{saturation}$ is the signal voltage in which an increase in the intensity of the light received by the photo-diode D1 does not affect the signal voltage. The saturation of the photo-diode D1 limits the dynamic range of the photo-diode D1. The range of the intensity of light being received by active pixel sensor which is usefully detectable is limited by the fact that the active pixel sensor saturates. Once the signal of the photo-diode D1 of the active pixel saturates, it is impossible to detect changes in the intensity of the light being received by the active pixel sensor. Further, when the intensity of light received by the photo-diode D1 is just below the intensity of light required to saturate the active pixel sensor, the response of the photo-diode D1 is very non-linear. The operation of the active pixel sensor is limited to a range of light intensities in which the response of the photo-diode D1 is linear.

It is desirable to have an active pixel sensor which allows the intensity of detectable light receive by the active pixel sensor to vary over a greater range than presently possible. The active pixel sensor would generate an analog voltage which represents the intensity of light received by the active pixel sensor over a greater range of light intensities than presently possible. Further, the active pixel sensor would be manufacturable using presently existing CMOS fabrication processes.

SUMMARY OF THE INVENTION

The present invention provides an active pixel sensor which provides detection of received light over a greater dynamic range of light intensity than presently possible. A gate capacitor is switched in parallel with a photo-diode within the active pixel sensor when the intensity of light being received by the active pixel sensor is potentially great enough to saturate the response of the active pixel sensor. The active pixel sensor maintains a high level of sensitivity at low levels of received light intensity. The active pixel sensor is compatible with low-cost CMOS fabrication processes.

A first embodiment of this invention includes an active pixel sensor. The active pixel sensor includes a photo-diode. The photo-diode conducting charge as a function of the intensity of light received by the photo-diode. The photo-diode includes a diode capacitance which collects charge conducted by the photo-diode which generates a photo-diode voltage. A switched capacitor is connected in parallel with the photo-diode when the photo-diode voltage drops below a pre-determined voltage potential. A capacitance of the switched capacitor adds to the diode capacitance when the switched capacitor is connected. The active pixel sensor further includes electronic circuitry to allow a controller to sample the photo-diode voltage.

Another embodiment of the invention is similar to the first embodiment, but includes the switched capacitor being a gate capacitor.

Other aspects and advantages of the present invention will become apparent from the following detailed description,

DETAILED DESCRIPTION

Figure 1:
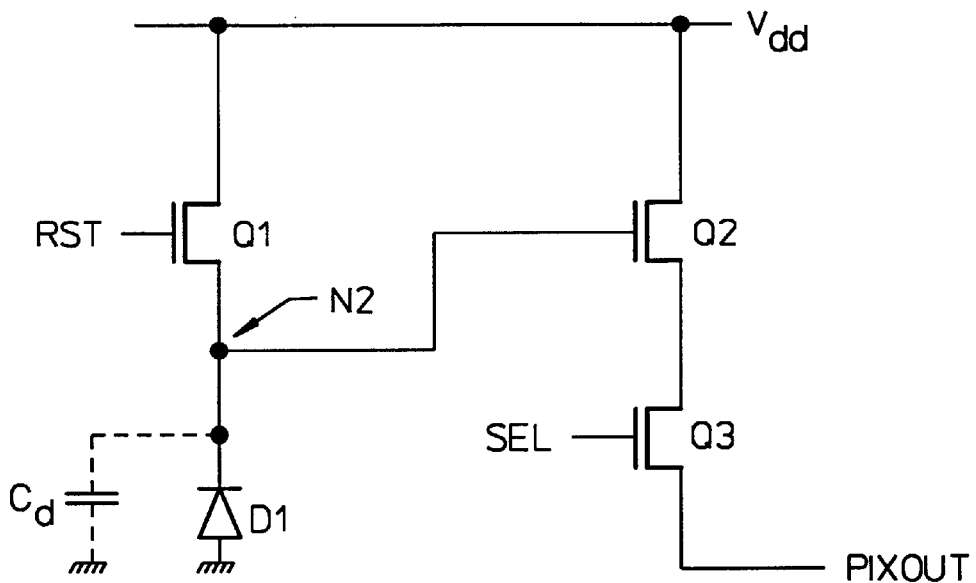
FIG. 1 shows a prior art active pixel sensor.
Figure 2:
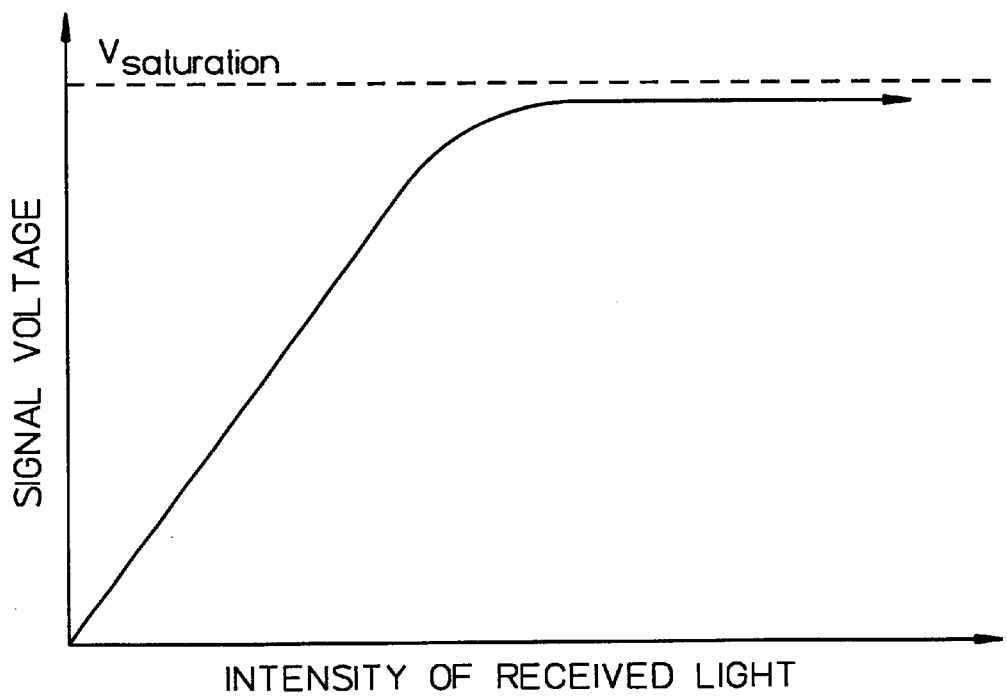
FIG. 2 is a plot of a signal voltage of the photo-diode of the active pixel sensor shown in FIG. 1.

As shown in the drawings for purposes of illustration, the invention is embodied in an active pixel sensor. The active pixel sensor provides detection of the intensity of received light over a greater dynamic range of light intensity than presently possible. A gate capacitor is switched in parallel with a photo-diode within the active pixel sensor when the intensity of light being received by the active pixel sensor is potentially great enough to saturate the response of the active pixel sensor. Further, the gate capacitor is not switched in parallel with the photo-diode within the active pixel sensor when the intensity of light received by the active pixel sensor is low. Therefore, the active pixel sensor maintains a high level of sensitivity at low levels of received light intensity.

Figure 3:
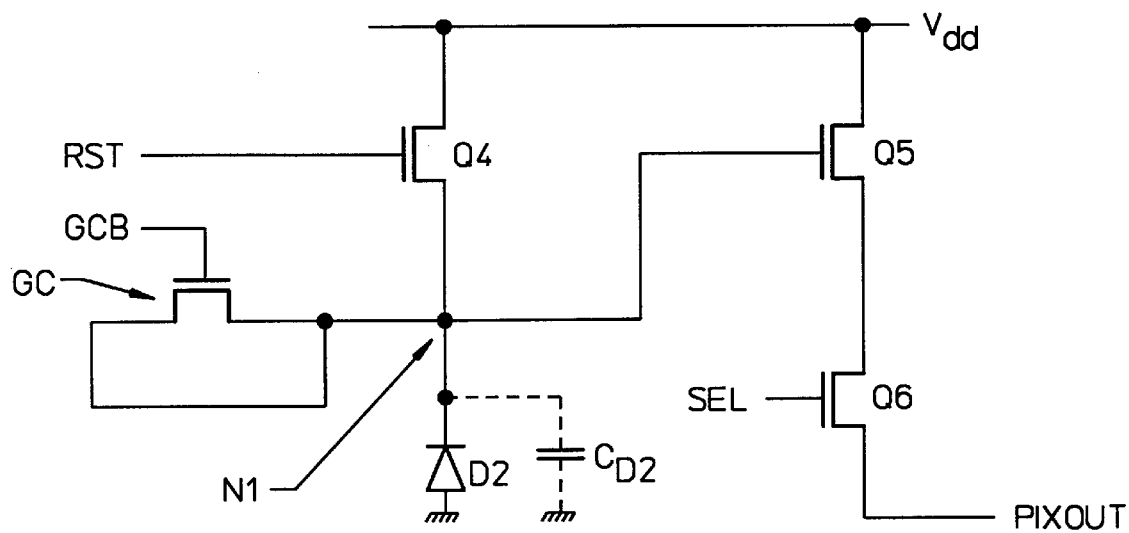
FIG. 3 shows an embodiment of the invention which includes a gate capacitor connected in parallel with the photo-diode of an active pixel sensor.

FIG. 3 shows an embodiment of the invention which includes a gate capacitor GC connected in parallel with a photo-diode D2 of an active pixel sensor. The gate capacitor GC includes a gate capacitor bias GCB. The gate capacitor GC is connected to the cathode of the photo-diode D2 at a signal node N1. The active pixel sensor includes a reset transistor Q4, a bias transistor Q5 and a select transistor Q6. The active pixel sensor further includes a power supply voltage Vdd.

The reset transistor Q4 allows the photo-diode D1 to be reset by discharging a photo-diode capacitance $C_{D2}$. A RST (reset) line discharges the photo-diode capacitance $C_{D2}$ by pulsing the RST line high to set the cathode of the photo-diode D2 to a predetermined reset voltage. The predetermined reset voltage for the active pixel sensor shown in FIG. 3 is the voltage potential of the RST line minus the threshold voltage of the reset transistor Q4.

The bias transistor Q5 and the select transistor Q6 allow a controller to selectively sample the photo-diode voltage of a particular active pixel sensor by pulsing a SEL (select) line to a voltage potential which causes the bias transistor Q5 and the select transistor Q6 to conduct. When the bias transistor Q5 and the select transistor Q6 to conducting, the photo-diode voltage is coupled to a PIXOUT output. The PIXOUT output can be sampled.

The gate capacitor GC is formed by connecting the source and the drain of an N-channel FET to the cathode of the photo-diode D2. When the FET within the gate capacitor GC is not conducting current, the gate capacitor GC does not affect the impedance connected to the signal node N1. However, when the FET within the gate capacitor GC is conducting current, the gate capacitor capacitively loads the signal node N1. The capacitance of the gate capacitor is connected in parallel with the capacitance $C_{D2}$ of the photo-diode D2 when the FET within the gate capacitor is conducting.

The FET within the gate capacitor GC conducts current when the voltage between the gate capacitor bias GCB and the signal node N1 is greater than the threshold of the FET within the gate capacitor GC. Typically, the threshold voltage of the FET within the gate capacitor GC ranges between 0.8 and 1.2 volts depending upon the effective channel length and the back gate bias of the FET within the gate capacitor GC.

The photo-diode D2 conducts charge when the photo-diode D2 is exposed to light. The charge conducted by the photo-diode D2 collects on capacitance connected to the signal node N1. Charge collected on the capacitance generates a negative voltage response on the signal node N1. The greater the amount of charge conducted by the photo-diode D2, the greater the reduction in the voltage potential on the signal node N1. The amount of charge conducted by the photo-diode D2 is dependent on the intensity of light received by the photo-diode D2.

The gate capacitor bias GCB is generally at a fixed voltage potential. Therefore, if the intensity of the light received by the photo-diode D2 is great enough, the gate capacitor GC will turn on. Once the gate capacitor GC turns on, charge collected by the photo-diode D2 is accumulated on a greater amount of capacitance. Therefore, the voltage potential on the signal node N1 will decrease less rapidly.

Figure 4:
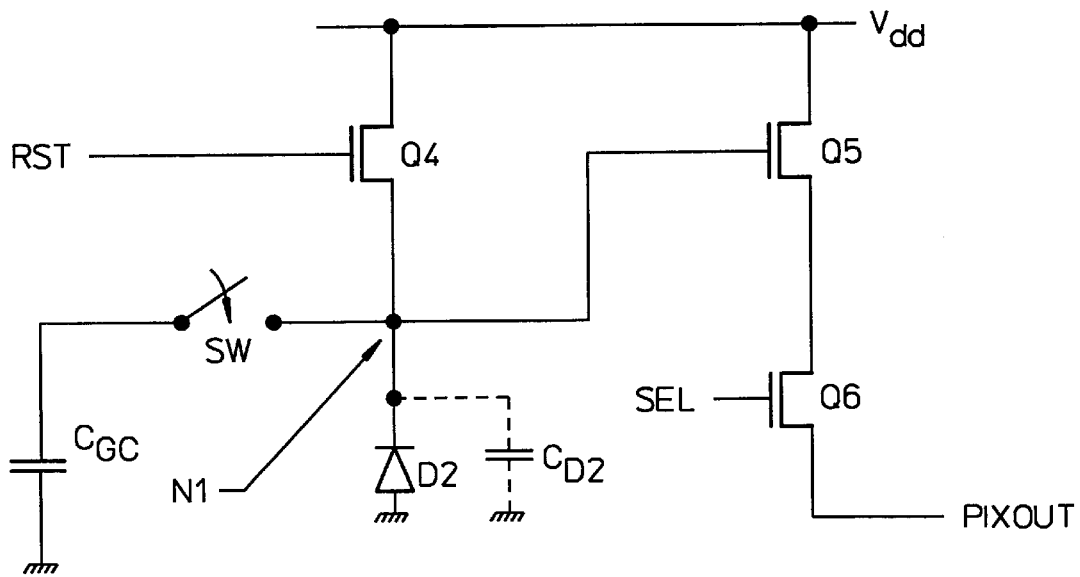
FIG. 4 shows an equivalent circuit of the embodiment shown in FIG. 3.

FIG. 4 shows an equivalent circuit of the embodiment shown in FIG. 3. The gate capacitor GC is represented by an equivalent gate capacitor CGC and a switch SW. The switch SW is connected when the voltage potential of the signal node N1 is lower than a predetermined voltage potential. The predetermined voltage potential is the voltage potential of the gate capacitor bias GCB minus the threshold voltage of the FET within the gate capacitor GC. The switch SW is unconnected when the voltage potential of the signal node N1 is greater than the predetermined voltage potential. The voltage potential of the signal node N1 is directly dependent upon the charge collected by the photo-diode D2. The charge collected by the photo-diode D2 is directly dependent upon the intensity of light received by the photo-diode. Therefore, if the intensity of light received by the photo-diode D2 is great enough, the switch SW will be connected and the equivalent gate capacitor CGC will be connected to the signal node N1.

Figure 5:
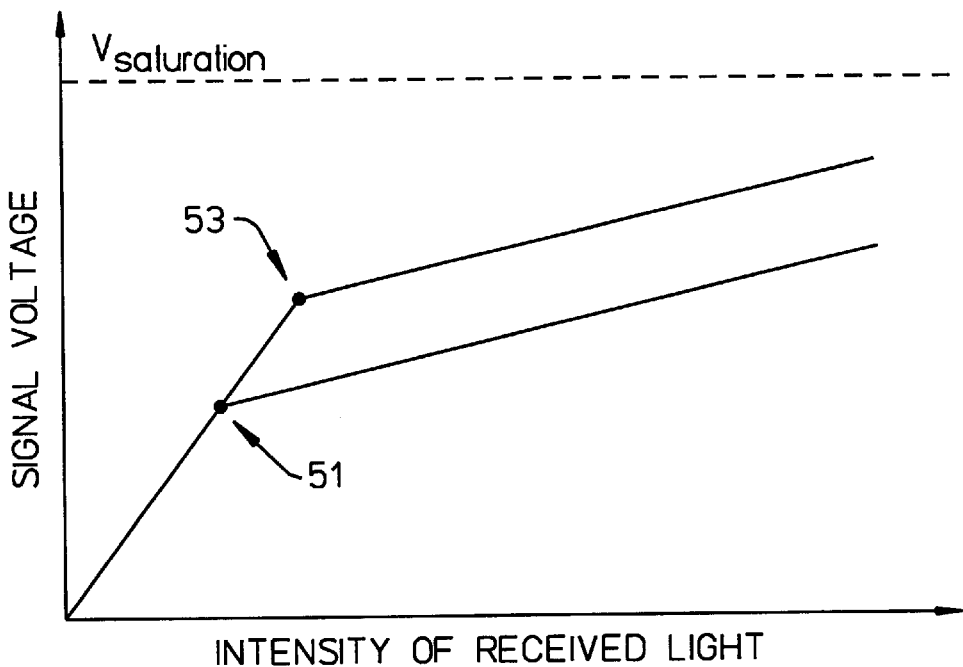
FIG. 5 is a plot of a signal voltage of the photo-diode of the active pixel sensor shown in FIG. 3.

FIG. 5 is a plot of a signal voltage of the photo-diode D2 of the active pixel sensor shown in FIG. 3. The signal voltage is defined as a reference voltage minus the voltage potential of the PIXOUT output. The reference voltage is defined as the voltage potential of the PIXOUT output when the signal node N1 is reset to predetermined reset voltage. The plot shows the signal voltage for two different values of gate capacitor bias GCB. Curve 51 shows the signal voltage for a first gate capacitor bias GCB. Curve 53 shows the signal voltage for a second gate capacitor bias GCB. The FET within the gate capacitor turns on at different values of signal voltage for the two different values of gate capacitor bias. Therefore, the points on the two curves 51, 53 where the capacitance of the gate capacitor GC is connected to the signal node N1 is different.

For both curves 51, 53 the sensitivity of the active pixel sensor changes when the gate capacitor GC is capacitively loading the signal node N1. The added capacitance prevents the active pixel sensor from entering a non-linear region where the voltage potential on the signal node N1 does not vary linearly with increased intensity of received light.

Figure 6:
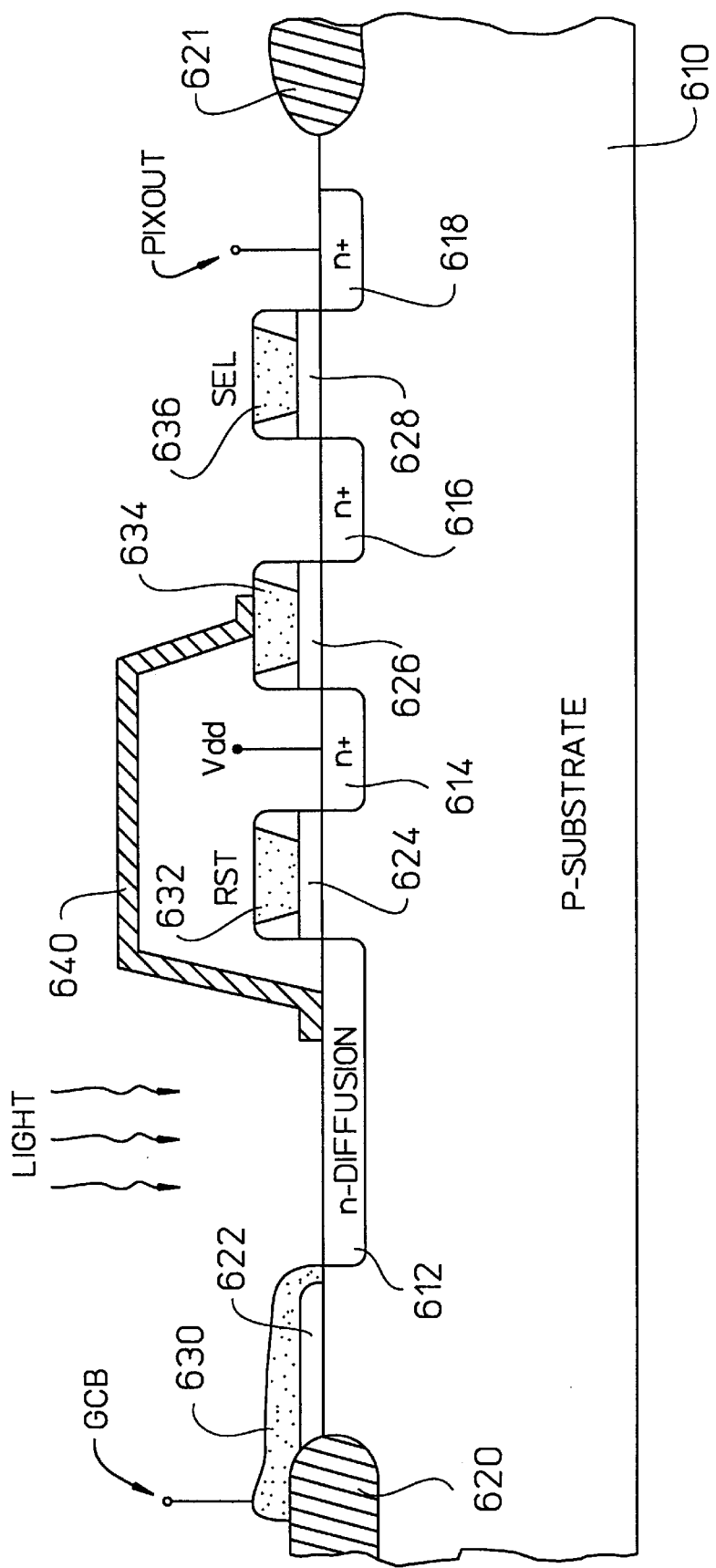
FIG. 6 shows an implementation of the active pixel sensor shown in FIG. 3.

FIG. 6 shows an implementation of the active pixel sensor shown in FIG. 3. The active pixel sensor is formed on a P-doped substrate 610. The active pixel sensor includes several N-doped regions 612, 612, 616, 618. The active pixel also includes several gate oxide regions 622, 624, 626, 628. Further, the active pixel includes several polysilicon regions 630, 632, 634, 636. The active pixel sensor also includes an oxide region 620. A metal region 640 connects the N-doped region 612 and the polysilicon region 634.

The photo-diode D2 is formed by the N-doped region 612 and the P-doped substrate 610. The gate capacitor GC is formed by the polysilicon region 630, the gate oxide region 622, the N-doped region 612 and the P-doped substrate 610. The reset transistor Q4 is formed by the polysilicon region 632, the gate oxide region 624, the N-doped region 612, the P-doped substrate 610 and the N-doped region 614. The bias transistor Q5 is formed by the polysilicon region 634, the gate oxide region 626, the N-doped region 614, the P-doped substrate 610 and the N-doped region 616. The select transistor Q6 is formed by the polysilicon region 636, the gate oxide region 628, the N-doped region 616, the P-doped substrate 610 and the N-doped region 618. Field oxide regions 620, 621 provides isolation. A metal region 640 provides an electrical interconnection between the N-doped region 612 and the polysilicon region 634.

Figure 7:
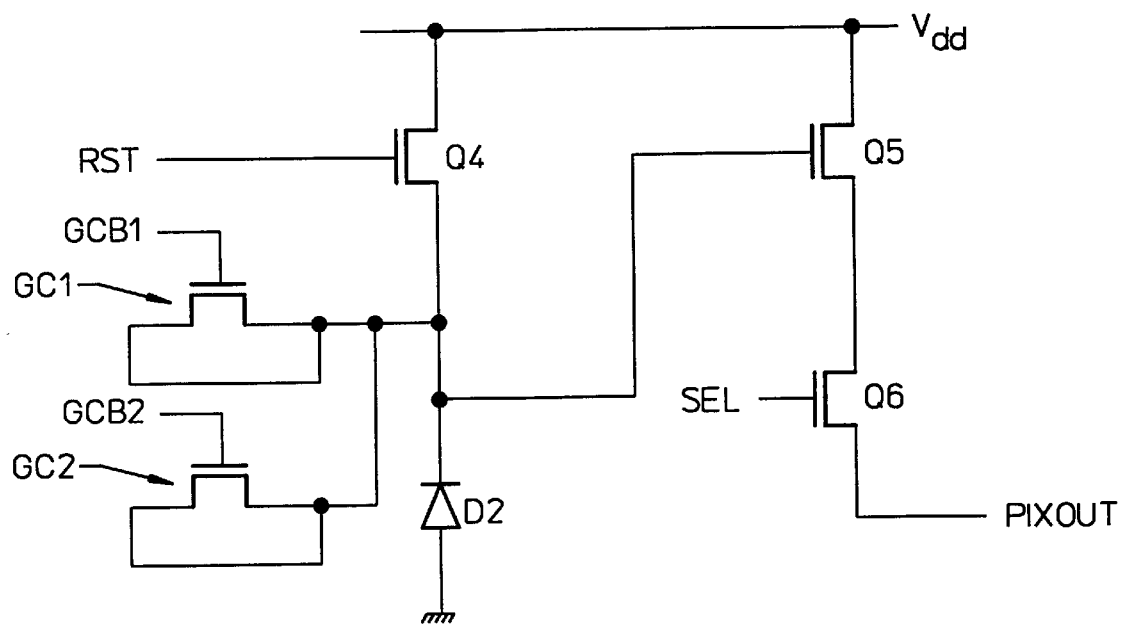
FIG. 7 is another embodiment of the invention which includes more than one gate capacitor connected in parallel with the photo-diode of the active pixel sensor.

FIG. 7 is another embodiment of the invention which includes more than one gate capacitor connected in parallel with the photo-diode D2 of the active pixel sensor. Generally, a first gate capacitor bias GCB1 of a first gate capacitor GC1 is different than a second gate capacitor bias GCB2 of a second gate capacitor GC2. Therefore, each gate capacitor GC1, GC2 capacitively loads the signal node N1 for different voltage potentials of signal node N1.

Figure 8:
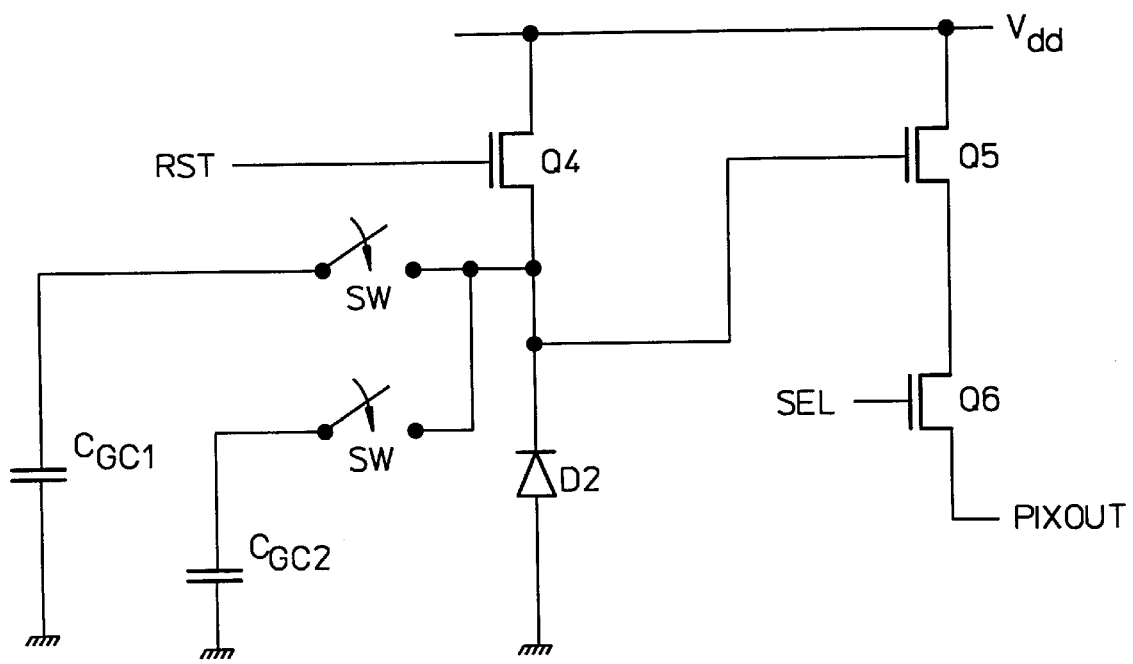
FIG. 8 shows an equivalent circuit of the embodiment shown in FIG. 7.

FIG. 8 shows an equivalent circuit of the embodiment shown in FIG. 7. The first gate capacitor is represented by an equivalent first gate capacitor $C_{GC1}$ and a first switch SW1. The second gate capacitor is represented by an equivalent second gate capacitor $C_{GC2}$ and a second switch SW2.

Figure 9:
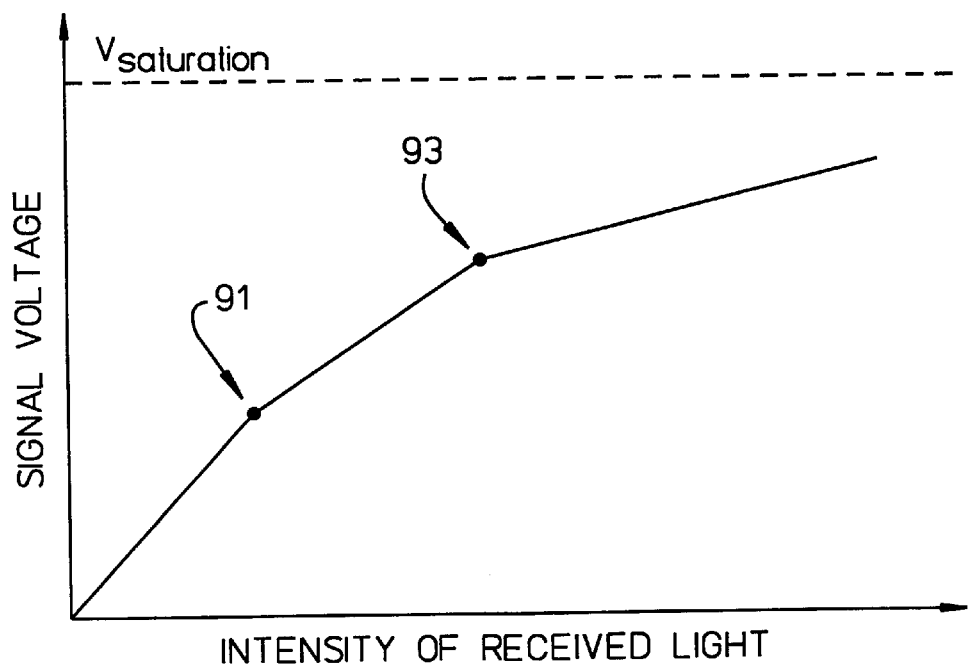
FIG. 9 is a plot of a signal voltage of the photo-diode of the active pixel sensor shown in FIG. 7.

FIG. 9 is a plot of a signal voltage of the photo-diode D2 of the active pixel sensor shown in FIG. 7. The signal voltage is defined as a reference voltage minus the voltage potential of the PIXOUT output. The reference voltage is defined as the voltage potential of the PIXOUT output when the signal node N1 is reset to predetermined reset voltage. The plot includes a first break point 91 and a second break point 93. The break points represent the points on the plot where a FET within the first gate capacitor GC1 and a FET within the second gate capacitor GC2 begin to conduct due to the decreasing voltage potential of the signal node N1.

Although specific embodiments of the invention have been described and illustrated, the invention is not to be limited to the specific forms or arrangements of parts so described and illustrated. The invention is limited only by the claims.

What is claimed is:

1. An active pixel sensor comprising:
   a photo-diode, the photodiode conducting charge as a function of an intensity of light received by the photo-diode, the photo-diode comprising a diode capacitance which collects charge conducted by the photo-diode generating a photo-diode voltage;
   a switched capacitor, providing a predetermined voltage potential, which is connected in parallel with the photo diode when the photo-diode voltage drops below the pre-determined voltage potential, a capacitance of the switched capacitor adding to the diode capacitance when the switched capacitor is connected; and
   means for sampling the photo-diode voltage.

2. The active pixel sensor as recited in claim 1, wherein the switched capacitor comprises a gate capacitor.

3. The active pixel sensor as recited in claim 2, wherein the switched capacitor comprises a plurality of gate capacitor s connected in parallel.

4. The active pixel sensor as recited in claim 2, wherein the gate capacitor includes a FET in which a source and a drain of the FET are connected to a cathode of the photo-diode.

5. The active pixel sensor as recited in claim 4, wherein the pre-determined voltage potential is selected by selecting a gate voltage of the FET within the gate capacitor.

6. The active pixel sensor as recited in claim 3, wherein each gate capacitor includes a FET in which a source and a drain of the FET are connected to a cathode of the photo-diode.

7. The active pixel sensor as recited in claim 6, wherein a plurality of pre-determined voltage potentials are selected by selecting a gate voltage of the FET within each gate capacitor.

8. The active pixel sensor as recited in claim 5, wherein the gate voltage is variably adjustable thereby variably adjusting the predetermined voltage potential.

9. The active pixel sensor as recited in claim 5, wherein the means for sampling the photo-diode voltage comprises a bias transistor and a select transistor.

\* \* \* \* \*